United States Patent
Inao et al.

(10) Patent No.: US 7,402,898 B2
(45) Date of Patent: Jul. 22, 2008

(54) SEMICONDUCTOR PACKAGE, METHOD FOR FABRICATING THE SAME, AND SEMICONDUCTOR DEVICE

(75) Inventors: Hisaho Inao, Niigata (JP); Tatsuya Hirano, Niigata (JP); Katsutoshi Shimizu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/196,321

(22) Filed: Aug. 4, 2005

(65) Prior Publication Data

US 2006/0027903 A1 Feb. 9, 2006

(30) Foreign Application Priority Data

Aug. 6, 2004 (JP) .............................. 2004-230718

(51) Int. Cl.
*H01L 23/02* (2006.01)
(52) U.S. Cl. .................. 257/678; 257/666; 257/99; 257/177; 438/106
(58) Field of Classification Search .................. 257/81, 257/99, 177, 678, 690, 666, 676; 438/106, 438/123
See application file for complete search history.

(56) References Cited

U.S. PATENT DOCUMENTS

| | | | | | |
|---|---|---|---|---|---|
| 5,937,279 | A | * | 8/1999 | Sawada et al. | 438/123 |
| 6,087,713 | A | * | 7/2000 | Haruta | 257/666 |
| 6,087,715 | A | * | 7/2000 | Sawada et al. | 257/666 |
| 2003/0075792 | A1 | * | 4/2003 | Ruhland | 257/693 |

FOREIGN PATENT DOCUMENTS

| | | | |
|---|---|---|---|
| JP | 62200752 A | * | 9/1987 |
| JP | 9-55489 A | | 2/1997 |

* cited by examiner

*Primary Examiner*—Jerome Jackson
*Assistant Examiner*—Jami M Valentine
(74) *Attorney, Agent, or Firm*—McDermott Will & Emery LLP (57) ABSTRACT

A semiconductor device includes a semiconductor chip, leads for sending and receiving signals between the semiconductor chip and an external device, fine metal wires, an encapsulant for sealing the leads, and a lid member. On the surface of each of the leads, a metal oxide film is formed by an oxidation treatment. The metal oxide film has a thickness larger than a natural oxide film and no more than 80 nm.

4 Claims, 9 Drawing Sheets

SEMICONDUCTOR PACKAGE, METHOD FOR FABRICATING THE SAME, AND SEMICONDUCTOR DEVICE

CROSS-REFERENCE TO RELATED APPLICATIONS

The present application claims priority under 35 USC 119(a) to Japanese Patent Application No. 2004-230718 filed on Aug. 6, 2004 the entire contents of which are hereby incorporated by reference.

BACKGROUND OF THE INVENTION (a) Field of the Invention

The present invention relates to a semiconductor package which is equipped with an LSI chip, a solid-state imaging element, a light receiving/emitting element or the like and is made of a resin, a method for fabricating the same, and a semiconductor device.

(b) Description of Related Art

Conventionally, a typical molding of a semiconductor package has been carried out by sandwiching a leadframe having leads, dam bars that couple the leads to each other and other components between respective regions of upper and lower parts of a molding die adjacent to its die cavity, pouring a resin in the die cavity, and then curing the resin.

Figure 9:
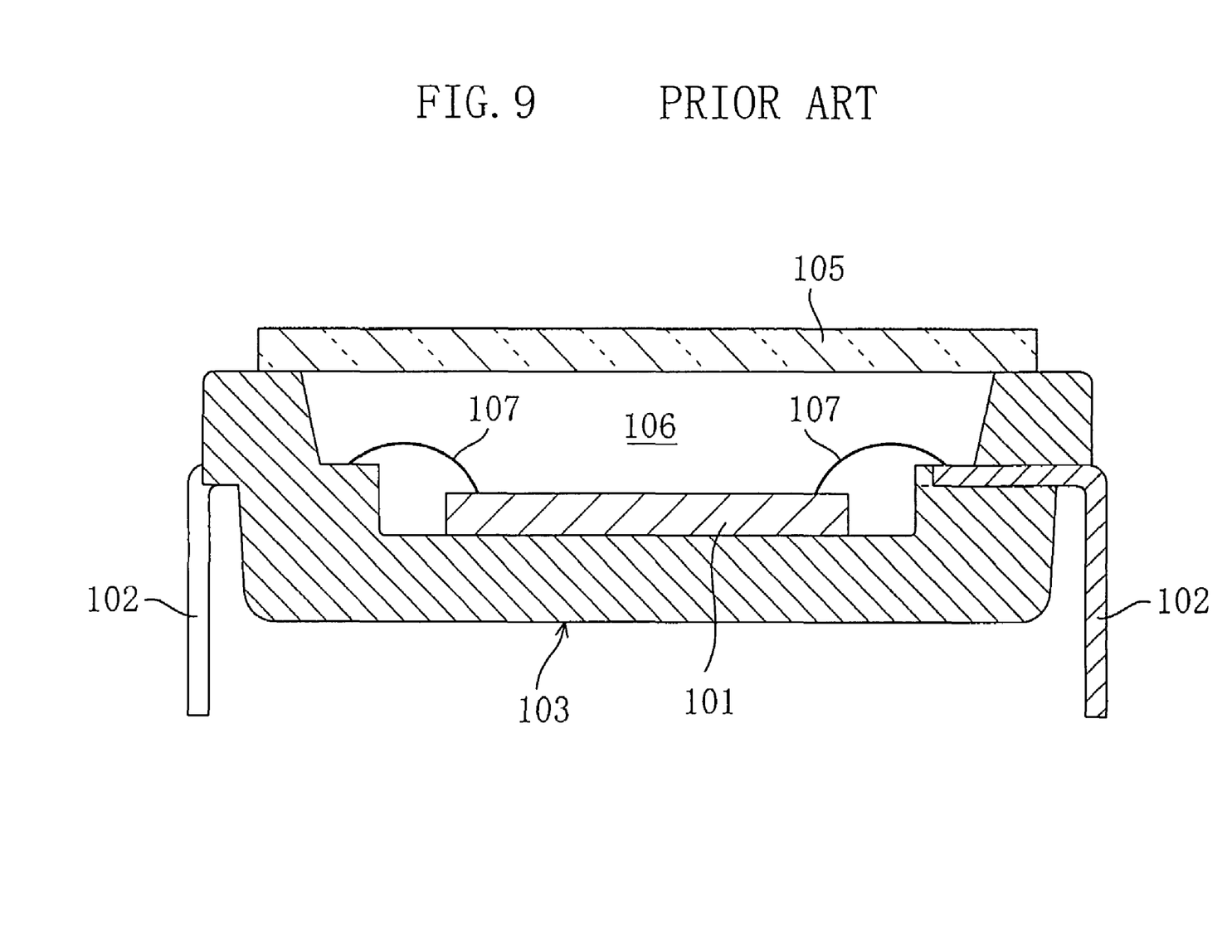
FIG. 9 is a cross sectional view illustrating the configuration of an optical device having a conventional semiconductor package.

FIG. 9 shows a cross sectional view illustrating a conventional optical device with a semiconductor package having an overhang structure.

As illustrated in FIG. 9, the optical device includes: an optical chip 101 such as a solid-state imaging element, a light receiving/emitting element or an LSI; leads 102 for sending and receiving signals between the optical chip 101 and an external device; fine metal wires 107 for connecting the optical chip 101 and the leads 102; a rectangular dished encapsulant 103 for sealing the leads 102; and a lid member 105 such as a glass window or a hologram which is attached to the top surface of the encapsulant 103. The encapsulant 103 is formed in one piece from a resin poured during molding.

The lid member 105 is attached to the top of the encapsulant 103, and the optical chip 101 is mounted at the center of the recess of the encapsulant 103. Therefore, the optical chip 101 is placed in an internal space 106 surrounded with the encapsulant 103 and the glass window 105.

SUMMARY OF THE INVENTION

In the conventional semiconductor packages, it is known that due to insufficient adhesive strength between leads and a resin, the resin is peeled off from the leads and water or moisture enters the inside of the semiconductor packages through bonded surfaces, or breakage chips resulting from partial peeling-off of the resin enter equipments or semiconductor devices during the fabrication, leading to various disadvantages.

An object of the present invention is to provide a semiconductor package with high reliability, a method for fabricating the semiconductor package, and a semiconductor device by taking measures to improve adhesivity of the leads of the semiconductor package to the resin.

The semiconductor package of the present invention has leads and an encapsulant for sealing part of each of the leads and is provided with a metal oxide film having a thickness of no less than 1.7 nm and no more than 80 nm on the surface of each of the leads.

With this configuration, adhesivity between a molding resin forming the encapsulant and the leads is improved, which prevents water or moisture from entering between the leads and the molding resin and prevents peeling-off of the molding resin. As a result, the reliability of the semiconductor package can be enhanced.

When the metal oxide film has a thickness of 10 nm or less, the aforementioned effect can be achieved while the efficiency in a plating process of the leadframe can be kept high.

The semiconductor device of the present invention is made by containing a semiconductor chip in the semiconductor package.

The method for fabricating the semiconductor package of the present invention comprises performing an oxidation treatment for a leadframe to form a metal oxide film having a thickness of no less than 1.7 nm and no more than 80 nm on the surface of the leadframe, and then forming an encapsulant with a molding material to seal parts of the leads.

According to the method, the semiconductor package having the aforementioned configuration can be obtained.

In the oxidation, the leadframe is preferably held in an atmosphere having an oxygen concentration of 20%±5% at a temperature in the range of 200 to 260° C. for one hour. Thus, a strong metal oxide film can be obtained.

DETAILED DESCRIPTION OF THE INVENTION

Figure 1:
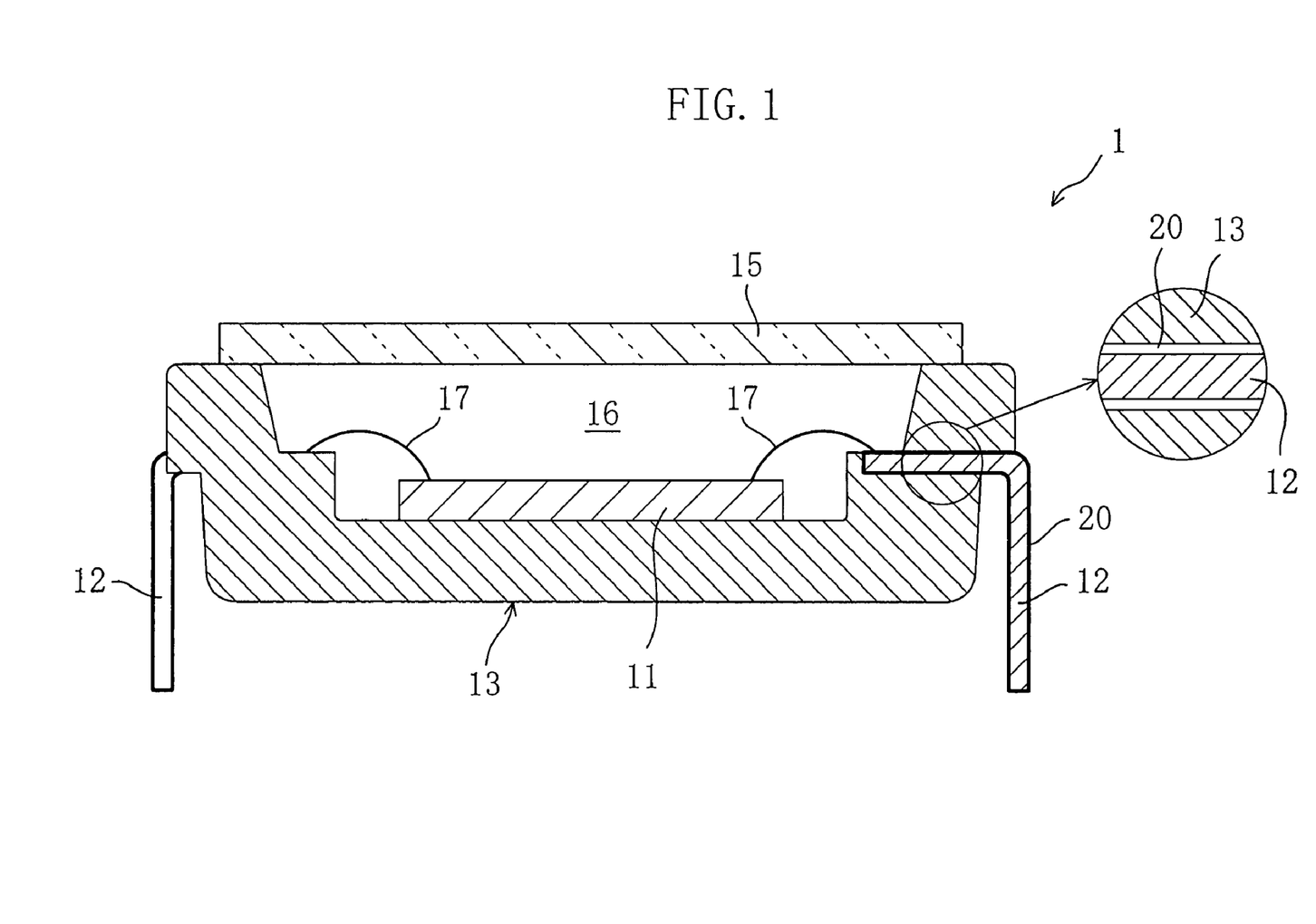
FIG. 1 is a cross sectional view of the configuration of a semiconductor device according to an embodiment of the present invention.

FIG. 1 is a cross sectional view illustrating the configuration of a semiconductor device 1 according to an embodiment of the present invention. The left end of FIG. 1 shows a cross section of a resin portion between leads, and the right end of FIG. 1 shows a cross section of a lead. As shown in FIG. 1, the semiconductor device 1 includes: a semiconductor chip 11 such as a solid-state imaging element, a light receiving/emitting element or an LSI; leads 12 for sending and receiving signals between the semiconductor chip 11 and an external device; fine metal wires 17 as electrically connecting members for connecting the semiconductor chip 11 to the leads 12; a rectangular dished encapsulant 13 for sealing the leads 12; and a lid member 15 such as a glass window or a hologram which is attached to the top surface of the encapsulant 13. The encapsulant 13 is formed in one piece from an epoxy resin poured during molding.

Moreover, the lid member 15 is attached to the top surface of the encapsulant 13, and the semiconductor chip 11 is mounted at the center of the recess of the encapsulant 13. Therefore, the semiconductor chip 11 is placed in an internal space 16 surrounded with the encapsulant 13 and the lid member 15.

In the embodiment, the leads 12 and the encapsulant 13 form a semiconductor package 2 and the semiconductor chip 11, the fine metal wires 17 and the lid member 15 are integrated with the semiconductor package 2 into a semiconductor device 1.

The feature of the semiconductor package of the embodiment resides in that a metal oxide film 20 (an oxide film made of a Fe—Ni alloy) is formed on the surface of each of the leads 12 by an oxidation treatment. The oxide film has a thickness of no less than 1.7 nm and no more than 80 nm.

The metal oxide film 20 of the embodiment is formed by holding the leadframe in an atmosphere having an oxygen concentration of 20%±5% at a temperature in the range of 200 to 260° C. for one hour.

In the embodiment, since the metal oxide film thicker than the natural oxide film is formed on the surface of each of the leads 12 by a heat treatment, adhesivity between the leads 12 and a resin of the encapsulant 13 can be enhanced. Therefore, it is possible to prevent water or moisture from entering between the leads 12 and the encapsulant 13 and to prevent the leads 12 from being peeled off from the encapsulant 13.

Next, there is described a fabrication process of the semiconductor package according to the embodiment of the present invention, using resin molding.

Figure 2A:
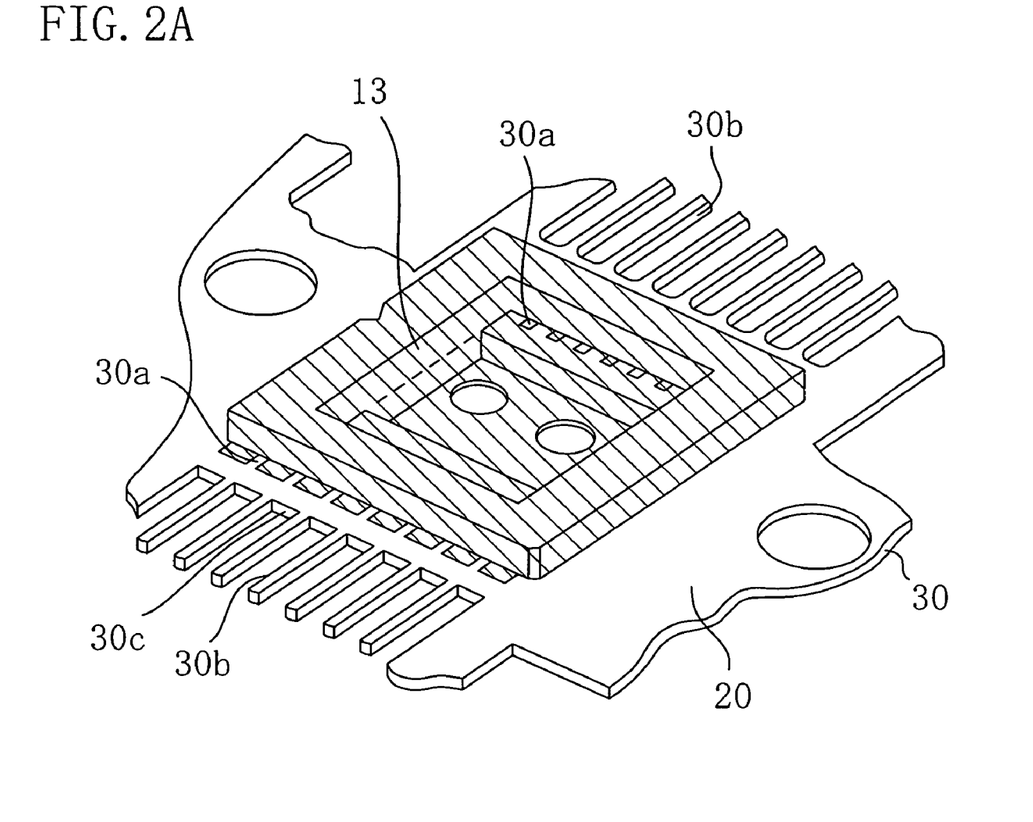
FIGS. 2A and 2B are a perspective view and a cross sectional view, respectively, of the configuration of a semiconductor package according to the embodiment at completion of a molding process step.
Figure 2B:
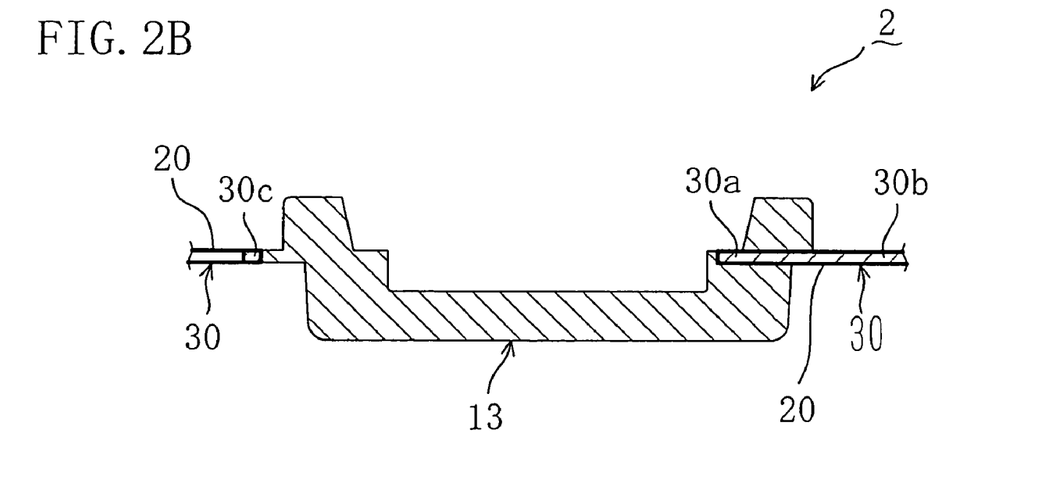

FIGS. 2A and 2B are a perspective view and a cross sectional view, respectively, of the configuration of a semiconductor package according to the embodiment at completion of a molding process step in the fabrication process. The left end of FIG. 2B shows a cross section of resin portion with no lead, and the right end of FIG. 2B shows a cross section of a lead. Note that the scale of FIG. 2A is not the same as that of FIG. 2B. As shown in FIGS. 2A and 2B, a leadframe 30 is sealed by the encapsulant 13 made of a molding resin. The encapsulant 13 is formed into one piece from the resin poured during the molding process step.

Regarding the leadframe 30, the leads inward of dam bars 30c are referred to as inner leads 30a and leads outward of the dam bars 30c are referred to as outer leads 30b. The leadframe 30 is provided with a large number of encapsulant formation regions. The ends of the upper surfaces of the inner leads 30a are exposed at the inside of the encapsulant 13. The exposed ends of the inner leads 30a are sites to which wires will be bonded later.

Prior to the molding process step, the leadframe 30 is subjected to an annealing treatment of keeping it in an atmosphere having an oxygen concentration of 20%±5% at a temperature in the range of 200 to 260° C. for one hour, so that the metal oxide film 20 is formed on the surface of the leadframe 30.

Subsequently, the dam bars 30c and part of the encapsulant 13 are punched out of the structure illustrated in FIG. 2. Then, after the wire bonding and/or the mounting of the lid member 15, the ends of the outer leads are cut off from the leadframe body and the leadframe is cut along the sides of the encapsulant at which no lead is provided, thereby separating individual semiconductor packages from the leadframe.

Figure 3:
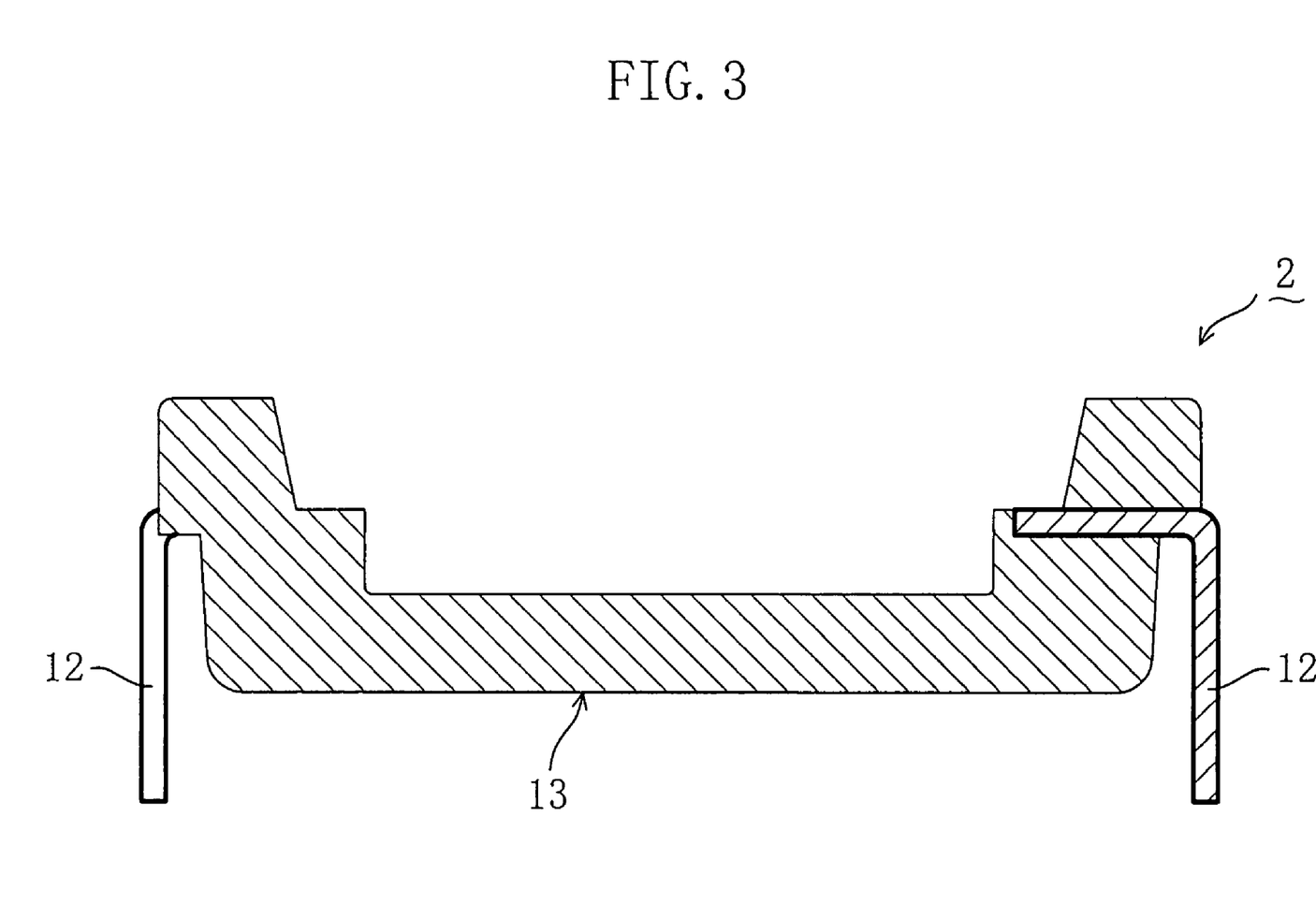
FIG. 3 is a cross sectional view of the semiconductor package according to the embodiment at completion of a lead bending process step.

Then, portions of the leads (outer leads) extending outside from the encapsulant 13 are bent down, so that the semiconductor package 2 is made in a configuration mountable on a mother board (lead bending process step).

FIG. 3 is a cross sectional view of the semiconductor package at completion of the lead bending process step. The left end of FIG. 3 shows a cross section of a resin portion with no lead, and the right end of FIG. 3 shows a cross section of a lead.

In the fabrication process of the semiconductor package according to the embodiment, prior to the molding process step, the annealing treatment is performed for oxidization to form the metal oxide film 20 on the surface of the leadframe 30. Therefore, after the molding, the molding resin can be strongly adhered to the leads 12 and thus the high-reliability semiconductor package and the high-reliability semiconductor device can be obtained.

Note that the lead bending process step may be performed before the mounting of the semiconductor chip 11 on the encapsulant 13 so as to form the semiconductor package shown in FIG. 3. Alternatively, the lead bending process step may be performed after the attachment of the lid member 15.

Test for Confirming Enhancement of Adhesivity Due to the Metal Oxide Film

Figures 4A, 4B:
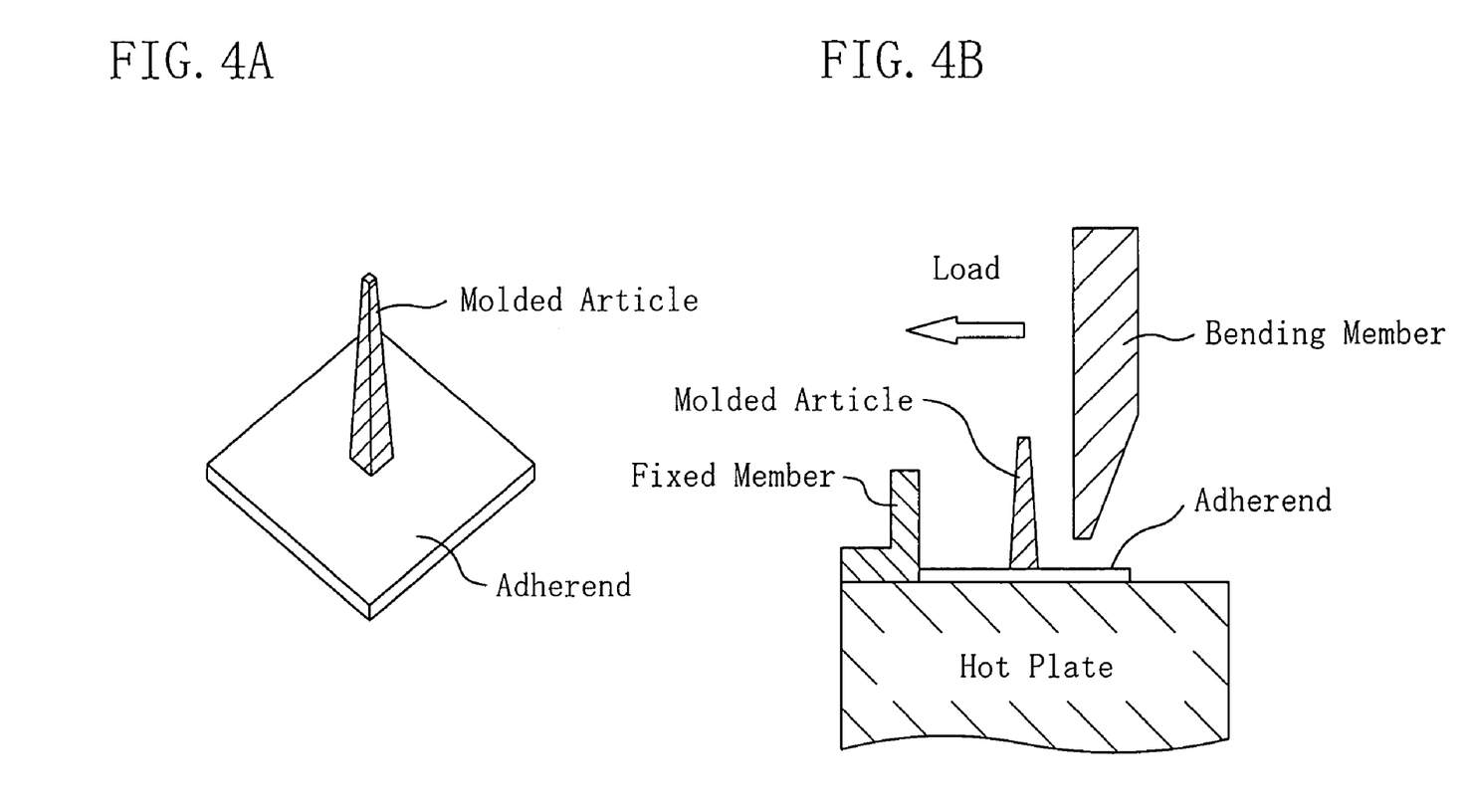
FIGS. 4A and 4B are a perspective view and a cross sectional view, respectively, schematically illustrating the configuration of a device for measuring adhesivity.

FIGS. 4A and 4B are a perspective view and a cross sectional view, respectively, schematically illustrating the configuration of a device for measuring adhesivity. As shown in FIG. 4A, a tower-like molded article was formed on an adherend made by forming a metal oxide film on a surface of a metal plate making up a leadframe. For the test, a plurality of adherends were used which have metal oxide films of various thicknesses. As shown in FIG. 4B, the adherend with the molded article was placed on a hot plate, a bending load was applied to the molded article by a bending member with the left end of the adherend brought into abutment on a fixed member, and adhesivity was measured on the basis of the load required to bend the molded article.

Figure 5:
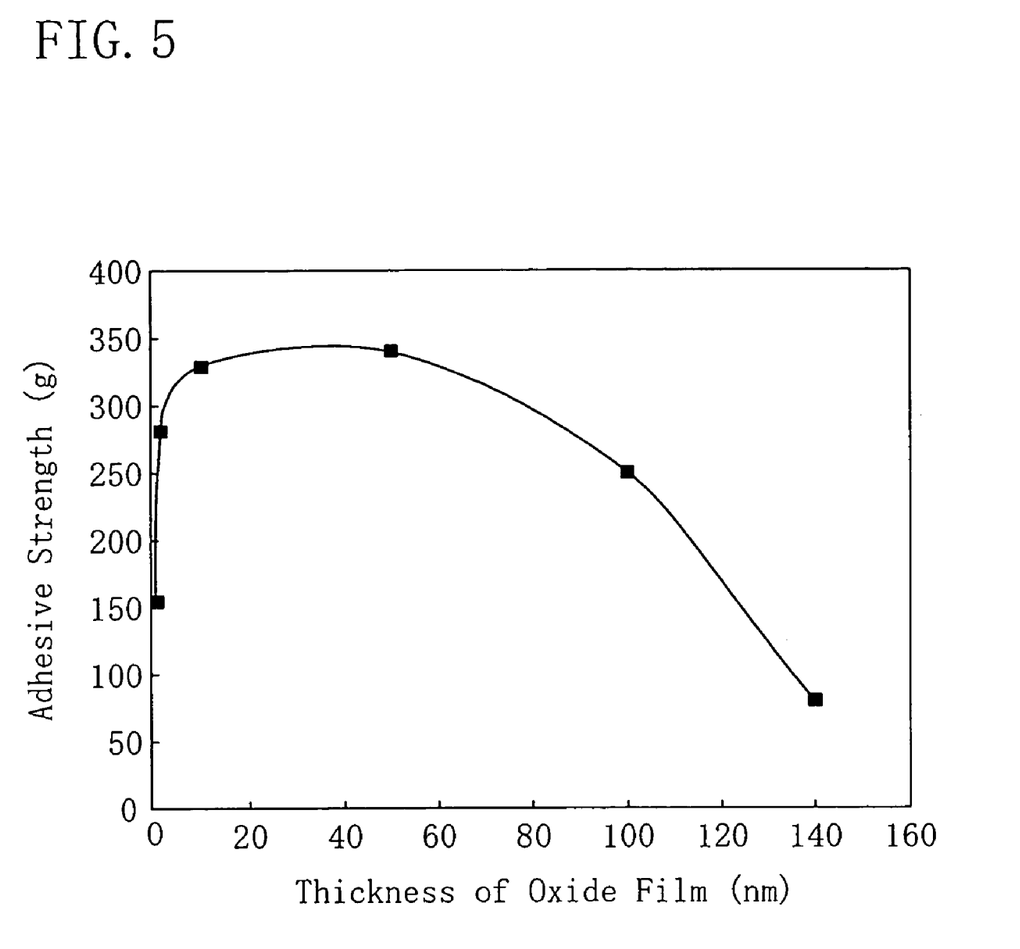
FIG. 5 is a graph illustrating the change of adhesivity between leads and a resin (epoxy resin) with the thickness of a metal oxide film.

FIG. 5 is a graph illustrating the change of adhesivity between leads and a resin (epoxy resin) with the thickness of a metal oxide film. As shown in FIG. 5, a great adhesivity can be obtained when the thickness of the oxide film is within the range of 1.7 nm to 80 nm both inclusive.

Figure 6:
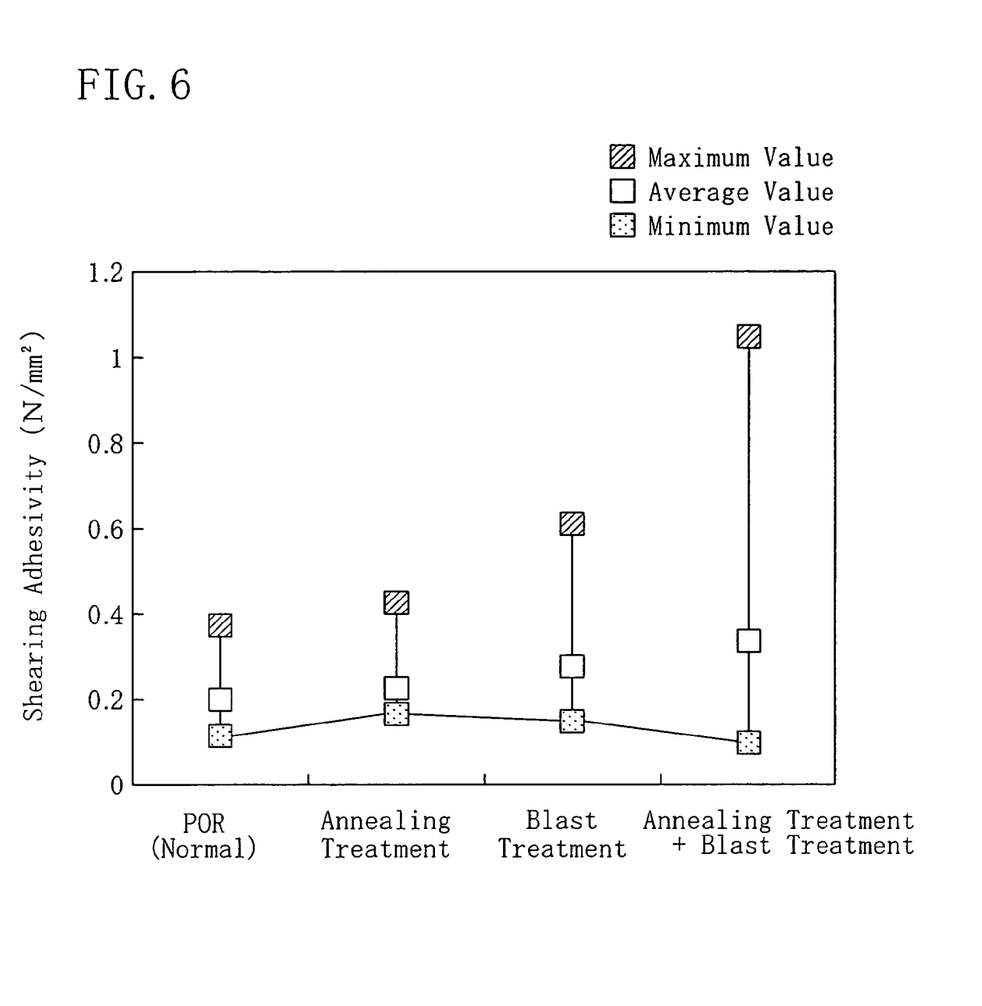
FIG. 6 is a graph illustrating measurement results of sharing adhesivity for a sample having a natural oxide film through no treatment for improving adhesivity of the leads (POR), a sample having a metal oxide film formed by an oxidation treatment (annealing treatment), a sample having the leads with large surface roughness formed by not the oxidation treatment but a blast treatment, and a sample subjected to both the oxidation treatment and the blast treatment.

FIG. 6 is a graph illustrating measurement results of sharing adhesivity for a sample having a natural oxide film without performing any treatment for improving adhesivity of the leads (POR), a sample having a metal oxide film formed by the oxidation treatment (annealing treatment), a sample having the leads with large surface roughness formed by not the oxidation treatment but a blast treatment, and a sample subjected to both the oxidation treatment and the blast treatment.

As shown in FIG. 6, all of the maximum value, the minimum value and the average value of the sample subjected to the annealing treatment are larger than those of the sample through no treatment. Turning to the sample subjected to the blast treatment and the sample subjected to both the oxidation treatment and the blast treatment, they have higher maximum values of the shearing adhesivity but lower minimum values thereof than the sample subjected to the annealing treatment, and thus the difference is widened. Hence, the result shown in FIG. 6 indicates that the sample having the oxide film formed by the oxidation treatment is most effective in improving the adhesivity.

Figure 7A:
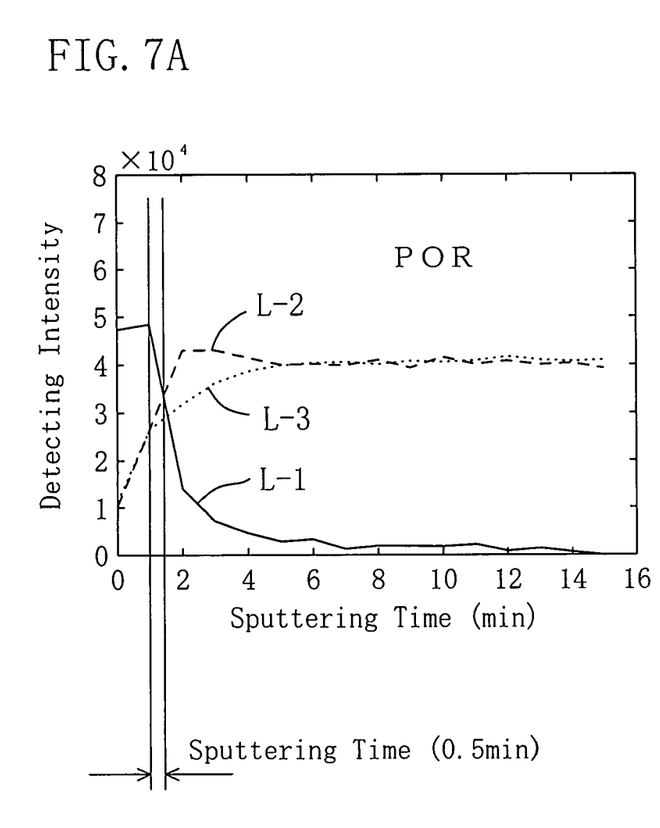
FIGS. 7A and 7B are graphs for comparing the thickness of an oxide film of the sample with no treatment (POR) with that of an oxide film of the sample subjected to the annealing treatment among the samples shown in FIG. 6.
Figure 7B:
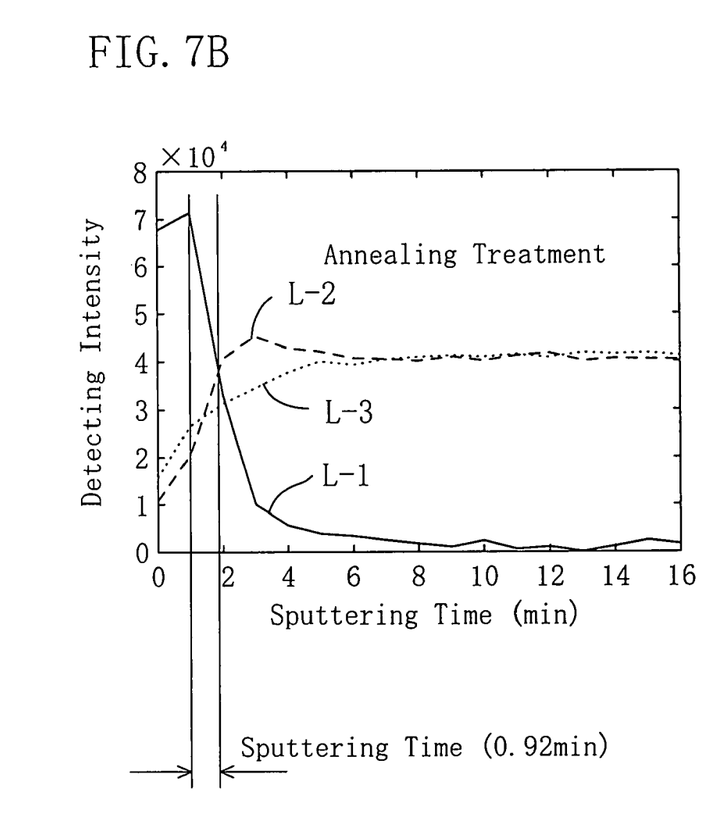

FIGS. 7A and 7B are graphs for comparing the thickness of an oxide film of the sample with no treatment (POR) to that of an oxide film of the sample subjected to only the annealing treatment among the samples shown in FIG. 6. The measurement conditions are as follows: an analysis region of ×3000; a stage angle of 30°, an electron beam acceleration voltage of 10 keV; an electron beam current of 10 nA; an ion beam energy of 1 keV; a sputtering rate of about 1.82 nm/min; and an etching interval of 1 (min). In FIGS. 7A and 7B, the abscissa axes denote sputtering time, and the ordinate axes denote detecting intensity of elements, wherein the solid lines L-1 denote detecting intensity of oxygen, the broken lines L-2 denote detecting intensity of nickel, and the dotted lines L-3 denote detecting intensity of iron. The time between the sputtering time at the peak value of the solid line L-1 and the sputtering time at the intersect point of the solid line L-1 and the broken line L-2 is obtained. Since the sputtering rate is about 1.82 nm/min, the thickness of the oxide film of the sample through no treatment (natural oxide film) can be obtained as follows: 1.82 nm×0.5 min (sputtering time)=0.91 nm. Likewise, the thickness of the metal oxide film of the sample subjected to only the annealing treatment can be obtained as follows: 1.82 nm×0.92 min=1.7 nm. Based upon the foregoing, the lead on which the metal oxide film having a thickness of 1.7 nm or more exhibits greater adhesive strength than the lead on which only the natural oxide film is formed.

Note that in forming the samples shown in FIGS. 5, 6, 7A and 7B, the leadframes were heated in an atmosphere having an oxygen concentration of 20% at a temperature of 200° C. for one hour. The results of experiments with different oxygen concentrations and heating temperatures showed that a strong metal oxide capable of effectively preventing the peeling-off between the leads and the molding resin can be formed by heating the leadframe in an atmosphere having an oxygen concentration of 20%±5% at a temperature in the range of 200 to 260° C. for one hour.

Summing up the data shown in FIGS. 5, 6, 7A and 7B, it can be understood that the metal oxide film having a thickness of no less than 1.7 nm and no more than 80 nm can improve the adhesive strength between the leads and the molding resin.

When the leadframe has a thick oxide film, there is a possibility that a stable film cannot be obtained without performing a plating treatment on the surfaces of the leads for a long time after a premolding process step. In particular, when the metal oxide film has a thickness of more than 10 nm, the time required for the plating pretreatment becomes longer, causing decrease in the treatment capacity.

Therefore, taking the efficiency of fabrication into consideration, the metal oxide film formed on the surface of each lead most preferably has a thickness of no less than 1.7 nm and no more than 10 nm.

Mechanism for Reinforcing Adhesivity Between Leads and Molding Resin

Next, the mechanism for reinforcing the adhesivity between leads and a molding resin in the present invention will be described.

When a medium A is a molding resin and a medium B is a lead, adhesion between the medium A and the medium B is either mechanical adhesion or chemical adhesion, but not physical adhesion with a solvent. In coupling flat members to each other without performing the blast treatment, the mechanical adhesion is not so high, and thus chemical adhesion is preferably used. When a molding resin such as an epoxy resin is used as a material for the medium A, OH groups on the side chain have been regarded as a reaction group in the adhesion. This is because the OH groups on the side chain have a higher degree of freedom than the terminal OH groups (OH groups formed in an epoxy curing reaction).

Figure 8A:
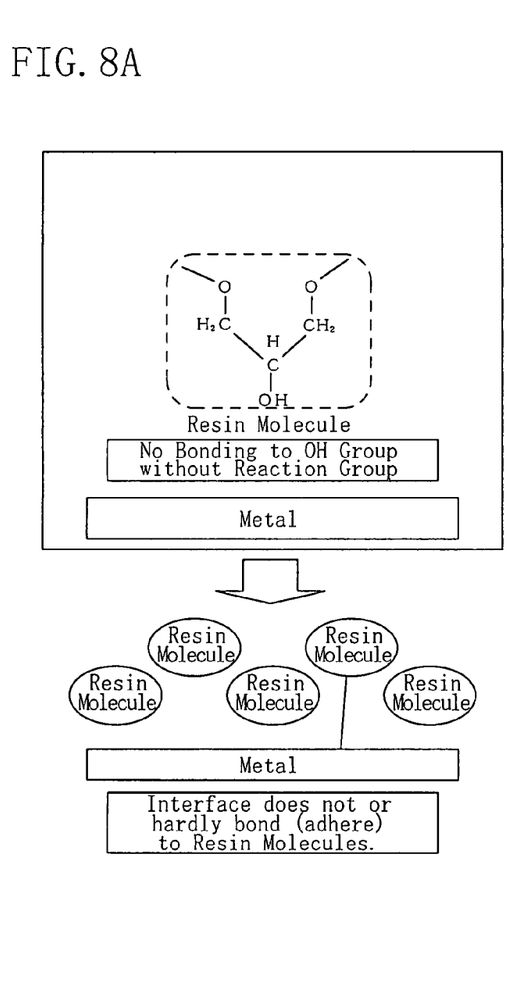
FIGS. 8A and 8B are a diagram illustrating an adhesion condition between a surface of a metal and resin molecules and a diagram illustrating an adhesion condition between an oxide film formed on a metal and resin molecules, respectively.
Figure 8B:
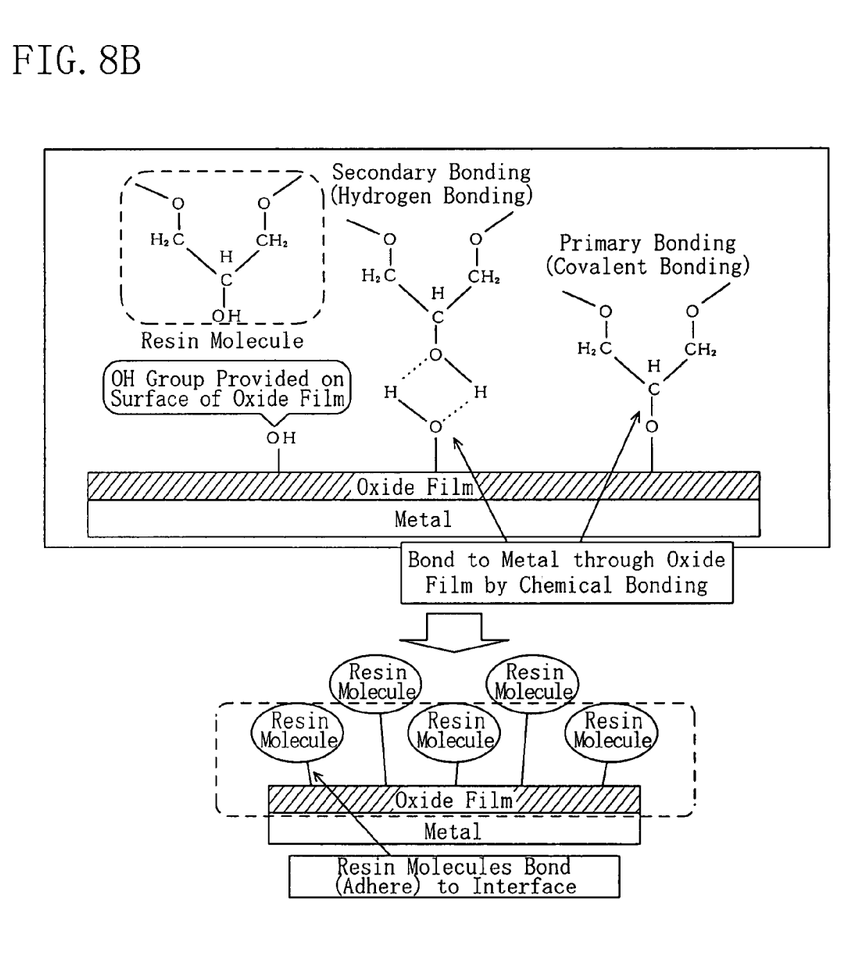

FIGS. 8A and 8B are a diagram illustrating an adhesion condition between the surface of a metal and resin molecules and a diagram illustrating an adhesion condition between an oxide film formed on a metal and resin molecules, respectively.

As shown in FIG. 8A, even when the molding resin has OH groups, strong adhesion cannot be obtained unless the lead has reaction groups bonded to the OH groups. In contrast, as shown in FIG. 8B, when an oxide film is formed on the surface of the lead, strong adhesivity can be obtained due to primary bonding between C and O with an ether group interposed therebetween and secondary bonding (hydrogen bonding) between O and H with a hydroxyl group interposed therebetween.

According to the inventors' experiments, the obtained adhesivity is not so strong in the case of a metal that is unlikely to be oxidized. This is because that there are few hydroxyl groups bonding the molding resin to the metal. However, it was found that even in the case of a metal on which an oxide film is unlikely to be formed, a strong adhesivity can be obtained by contriving the metal to have an oxide film thereto.

Note that for example when the lead is made of a copper alloy, the obtained oxide film is too thick and has a double structure, causing, by contrast, the adhesivity between the lead and the molding resin to decrease. Therefore, there is an upper limit to the appropriate range of thicknesses of the oxide film.

The embodiment has described on the semiconductor package of which the encapsulant is dish-shaped and has an internal space, but the semiconductor device of the present invention is also applicable to semiconductor packages with no internal space and with the surroundings of the semiconductor chip and the fine metal wires being filled with a molding resin.

The aforementioned semiconductor package of the present invention, the method for fabricating the same, and the semiconductor device can be used for a semiconductor device on which a solid-state imaging element, a light receiving/emitting element, and an LSI such as a memory and a logic, or a method for fabricating the same.

What is claimed is:

1. A semiconductor package, comprising:
   a plurality of leads for sending and receiving signals between a semiconductor chip and an external device; and
   an encapsulant for sealing at least part of each of the plurality of leads, wherein a metal oxide film having a substantially uniform thickness in a range of no less than 1.7 nm and no more than 10 nm is formed on the entire surface of each of the plurality of leads, the plurality of leads are made of a Fe—Ni alloy, and the metal oxide film is an oxide film made of a Fe—Ni alloy.

2. A semiconductor device, comprising:

a semiconductor chip;

a plurality of leads for sending and receiving signals between the semiconductor chip and an external device;

a connecting member for electrically connecting parts of the semiconductor chip to the plurality of leads; and an encapsulant for sealing at least part of each of the plurality of leads, wherein a metal oxide film having a substantially uniform thickness in a range of no less than 1.7 mn and no more than 10 nm is formed on the entire surface of each of the plurality of leads, the plurality of leads are made of a Fe—Ni alloy, and the metal oxide film is an oxide film made of a Fe—Ni alloy.

3. The semiconductor device of claim 2, wherein a hollow is formed over the semiconductor chip.

4. The semiconductor device of claim 2, wherein the semiconductor chip serves as an image sensor.

* * * * *